(12) United States Patent
Pham et al.

(10) Patent No.: US 7,705,439 B2
(45) Date of Patent: Apr. 27, 2010

(54) DESTRUCTOR INTEGRATED CIRCUIT CHIP, INTERPOSER ELECTRONIC DEVICE AND METHODS

(75) Inventors: Cuong V. Pham, San Diego, CA (US); David E. Chubin, Northridge, CA (US); Aaron D. Kuan, Huntington Beach, CA (US); Colleen L. Khalifa, Perris, CA (US)

(73) Assignee: Teledyne Technologies Incorporated, Thousand Oaks, CA (US)

( * ) Notice: Subject to any disclaimer, the term of this patent is extended or adjusted under 35 U.S.C. 154(b) by 289 days.

(21) Appl. No.: 11/043,626

(22) Filed: Jan. 25, 2005

(65) Prior Publication Data
US 2010/0032776 A1 Feb. 11, 2010

(51) Int. Cl.
*H01L 23/02* (2006.01)

(52) U.S. Cl. ............... 257/678; 257/922; 257/E23.002; 438/106; 438/121

(58) Field of Classification Search ................. 257/922, 257/E23.002, 678
See application file for complete search history.

(56) References Cited

U.S. PATENT DOCUMENTS

| | | | |
|---|---|---|---|
| 3,725,671 A * | 4/1973 | Keister et al. ............... | 327/525 |
| 3,860,835 A | 1/1975 | Brymer et al. | |
| 4,175,990 A * | 11/1979 | Hattori et al. ............... | 149/21 |
| 4,962,415 A | 10/1990 | Yamamoto et al. | |
| 5,027,397 A | 6/1991 | Double et al. | |
| 5,233,505 A | 8/1993 | Chang et al. | |
| 5,858,500 A | 1/1999 | MacPherson | |
| 5,861,662 A | 1/1999 | Candelore | |
| 6,201,707 B1 | 3/2001 | Sota | |
| 6,524,462 B1 | 2/2003 | Lowe | |
| 6,930,023 B2 * | 8/2005 | Okada et al. ............... | 438/459 |
| 7,489,013 B1 | 2/2009 | Chubin et al. | |
| 2002/0199111 A1 | 12/2002 | Clark et al. | |
| 2004/0244889 A1 * | 12/2004 | Sailor et al. ............... | 149/2 |

FOREIGN PATENT DOCUMENTS

DE 102 52 329 A1 * 5/2004

OTHER PUBLICATIONS

English translation of DE 102 52 329 A1 (refer to section on Foreign Patent Documents above for details).*

(Continued)

*Primary Examiner*—Thao X Le
*Assistant Examiner*—Ajay K Arora
(74) *Attorney, Agent, or Firm*—K&L Gates LLP

(57) ABSTRACT

A semiconductor chip includes a first integrated circuit chip and a depression substrate attached to the integrated circuit chip, wherein the integrated circuit chip and the depression substrate define a cavity therebetween. The semiconductor chip also includes a stress sensitive material located in the cavity and a chemical located in the cavity, wherein detection of tampering causes a reaction by the chemical such that the semiconductor chip is at least partially destroyed.

14 Claims, 5 Drawing Sheets

OTHER PUBLICATIONS

U.S. Appl. No. 11/252,402, filed Oct. 18, 2005.
Office Action issued on Oct. 9, 2007 in U.S. Appl. No. 11/252,402.
U.S. Appl. No. 11/252,403, filed Oct. 17, 2005.
Office Action issued on Oct. 13, 2006 in U.S. Appl. No. 11/252,403.
Office Action issued on Feb. 20, 2007 in U.S. Appl. No. 11/252,403.
Office Action issued on Oct. 18, 2007 in U.S. Appl. No. 11/252,403.
U.S. Appl. No. 11/944,771, filed Nov. 26, 2007.

D3 Tamper Respondent Systems Product Brochure, 2001, 6 pages.
D3 Technology Tamper Respondent Sensors and Enclosures, W.L. Gore & Associates (UK) Ltd. Dundee Technology Park, Dundee DD2 1JA, Scotland, 2 pages.
Pyrofuze®, Sigmund Cohn Corp., Mount Vernon, New York, printed from http://www.sigmundcohn.com/pyrofuse.html, 2 pages.
Office Action issued on Mar. 27, 2008 in U.S. Appl. No. 11/252,402.
Office Action issued on Apr. 16, 2008 in U.S. Appl. No. 11/252,403.

* cited by examiner

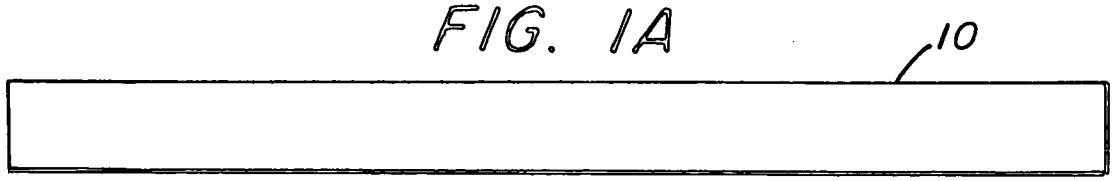
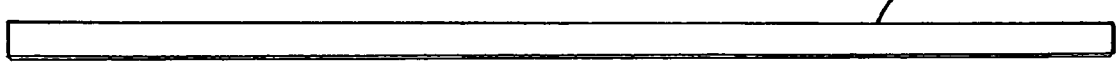
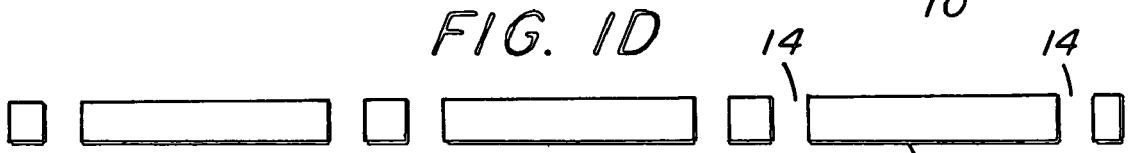
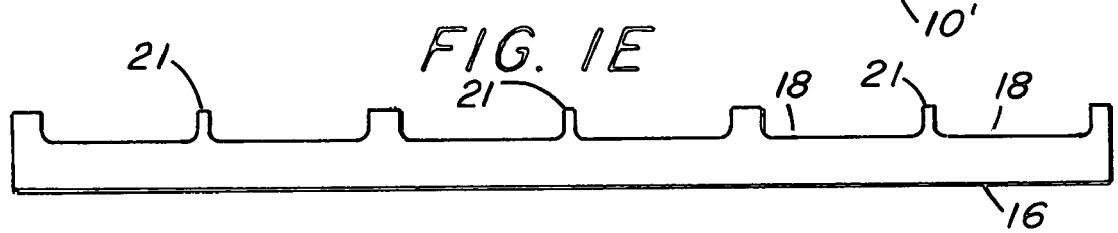
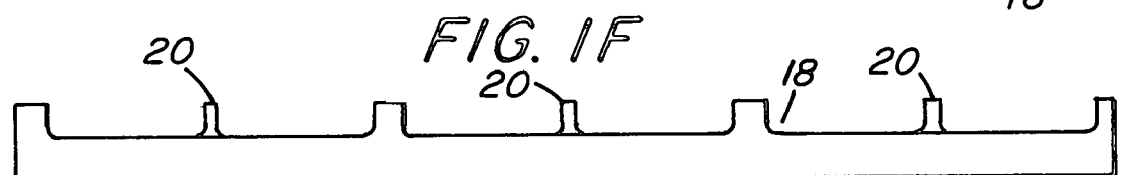
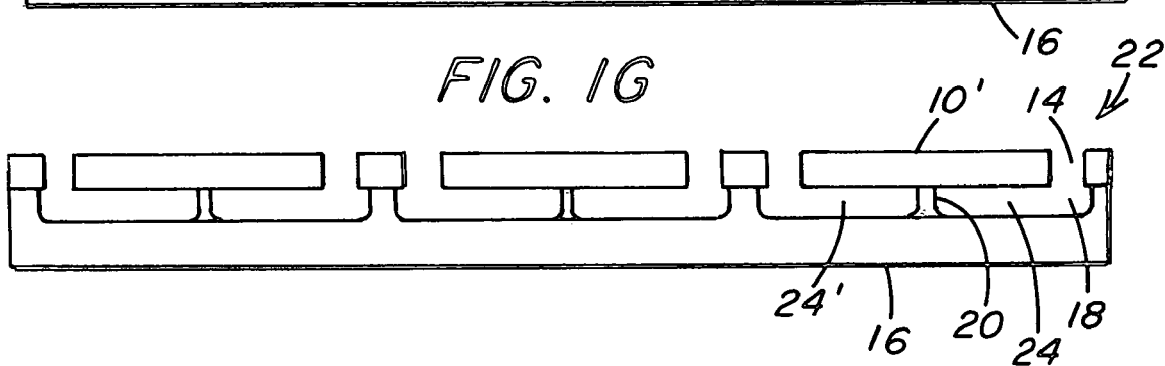

DESTRUCTOR INTEGRATED CIRCUIT CHIP, INTERPOSER ELECTRONIC DEVICE AND METHODS

BACKGROUND

Anti-tamper ("AT") protection is employed so that it is very difficult to reverse engineer or alter the function of electronic hardware (e.g., computer processors, integrated circuits, multi-chip modules, etc). For some commercial applications, designers often spend vast sums of money to develop a "next generation" circuit. These companies often wish to deter, or at least hamper a competitor's reverse engineering efforts. The motivation in this case is to protect valuable intellectual property. Military and Government users also have a strong interest in AT protection. When new military hardware is fielded, often the consequences of capture are not fully understood or considered by the designer of the hardware. Similarly, the combat loss of any one of a thousand pieces of sensitive, high-tech military hardware could do irreparable damage to national security.

AT standards have been defined according to the Federal Information Protection Standard (FIPS) 140-2. The standard describes the requirements for four levels of protection. For the standards for multi-chip, embedded modules, Level 1 calls for standard passivation techniques (i.e., a sealing coat applied over the chip circuitry to protect it against environmental or other physical damage). The standard describes that Level 2 can be achieved using anti-tamper coatings or passive AT. Level 3 may use passive AT if tampering will likely destroy the module. Level 4 requires the use of active AT technologies.

Most AT is categorized as either passive or active. In each case, the intent is to delay, prevent or stop tampering and potential reverse engineering of an electronic circuit. Passive AT is currently the most widespread method of deterring an opponent from reverse engineering or spoofing an electronic circuit. Current passive AT arrangements include encapsulation and various types of conformal coatings such as epoxies. Methods to defeat common encapsulents are well documented.

Layered anti-tamper arrangements are also employed in which alternating layers of passive AT with active AT yields a synergy in probing difficulty. With active AT methods, a protected circuit will take some action when unauthorized activities are detected. Any number of events can trigger a programmed circuit response. Examples of active triggering arrangements include: voltage, photon detection, acceleration, strain, thermal, chemical attack, and proximity or tamper-respondent enclosures. The response of an active AT circuit upon triggering is also widely variable. For example, zeroization may be employed in which critical memory cells or an entire die can be erased. Similarly, a response can trigger overwriting of some or all of a memory die. Another detection response is to physically obliterate or mutilate the circuit using, for example, embedded microexplosive charges beneath dice. In this case, when power is improperly removed or when tampering is otherwise detected, the circuit literally destroys itself.

SUMMARY

In one embodiment, the present invention is directed to a semiconductor chip including an integrated circuit chip and a depression substrate attached to the integrated circuit chip, wherein the integrated circuit chip and the depression substrate define a cavity therebetween. The semiconductor chip also includes a stress sensitive material located in the cavity and a chemical located in the cavity, wherein detection of tampering causes a reaction by the chemical such that the semiconductor chip is at least partially destroyed.

In one embodiment, the cavity includes a stress-sensitive material, such as a piezoelectric, located therein. In such an embodiment, when an intrusion is detected and a signal received, the stress-sensitive material initiates a reaction by the chemical such that the package is at least partially destroyed.

In one embodiment, the cavity includes a stress-sensitive material, such as a piezoelectric, located therein. In such an embodiment, when an intrusion is detected and a signal received, the stress-sensitive material reacts such that the package is at least partially destroyed.

In one embodiment, the present invention is directed to a destructor electronic device. The destructor electronic device includes an interposer defining a cavity therein and a chemical located in the cavity. The semiconductor package also includes a conductive via extending from a top surface of the interposer to the cavity, wherein an electrical signal passed through the conductive via causes a reaction by the chemical such that the destructor electronic device is at least partially destroyed.

In one embodiment, the present invention is directed to a semiconductor interposer. The semiconductor interposer includes a first substrate and a second substrate, wherein the first substrate and the second substrate define a cavity therebetween. The semiconductor interposer also includes a stress-sensitive material located in the cavity, wherein receipt of a signal from a sensor causes a reaction by the stress-sensitive material such that the semiconductor interposer is at least partially destroyed.

In one embodiment, the present invention is directed to a method of fabricating a destructor electronic device. The method includes attaching a first substrate to a second substrate such that a cavity is formed therebetween, wherein one of the first substrate and the second substrate includes an opening to the cavity and filling at least a portion of the cavity with a chemical.

In one embodiment, the present invention is directed to a method of fabricating a destructor electronic device. The method includes forming a via in a first substrate, forming an opening in the first substrate, and filling the via with a conductive material. The method also includes forming a channel in a second substrate, bonding the first substrate to the second substrate such that the opening and the channel form a reservoir and the via extends into the reservoir, and filling at least a portion of the reservoir with a chemical.

In various embodiments, the present invention is directed to methods of fabricating semiconductor and MCM packages. The packages can be fabricated from a number of materials including high temperature co-fired ceramic (HTCC), low temperature co-fired ceramic (LTCC), silicon dioxide, aluminum oxide, beryllium oxide ceramics, epoxy-glass laminate, polyimide-glass laminate, etc.

BRIEF DESCRIPTION OF THE FIGURES

FIGS. 1A through 1J illustrate embodiments of a cross section of a destructor integrated circuit chip in various stages of fabrication;

DESCRIPTION

Various embodiments of the present invention include packages, for example, integrated circuits and multi-chip modules that include an anti-tampering feature that causes the package or a portion of the package to be damaged, deformed, and/or destroyed upon detection of tampering. In various embodiments, after tamper detection by a sensor (e.g., a passive sensor or an active sensor), an actuator such as, for example, a metal hydrate actuator, a piezoelectric actuator, a magnetostrictive actuator, a swellable polymer gel actuator, or a shape alloy memory actuator may be used to trigger or cause damage, deformation, and/or destruction of the package or a portion of the package.

Figure 1H:
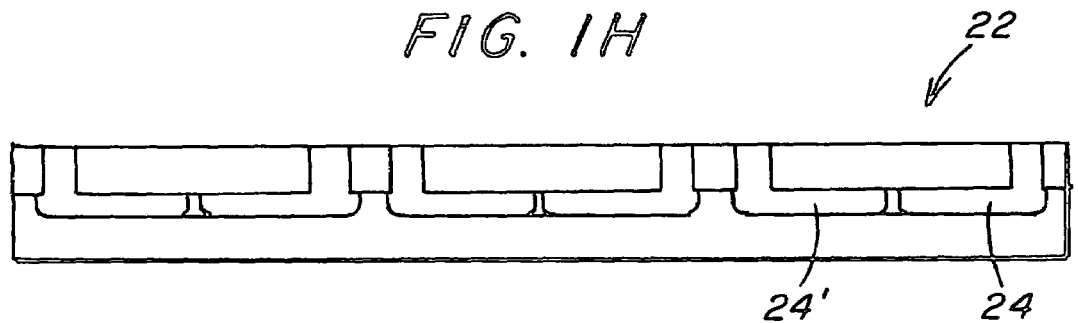

FIGS. 1A through 1J illustrate embodiments of a cross section of a destructor integrated circuit chip in various stages of fabrication. As shown in FIG. 1A, fabrication starts with an integrated circuit "IC" wafer 10 (e.g., a wafer constructed of Silicon) that will form the roof of the destructor integrated circuit chip. In FIG. 1B, the wafer 10 is reduced in thickness to form wafer 10' so that the wafer 10' may readily break during a destructive event. By way of example, the wafer 10 may be thinned from about 0.020 in. to 0.005 in. In FIG. 1C, a layer 12 such as a photoresist layer is formed on the wafer 10' to define the structure of the destructor integrated circuit chip.

As shown in FIG. 1D, photoresist is deposited onto the wafer 10', which is then masked and hardened. The wafer 10' is etched to form openings 14. The photoresist is then stripped. In FIG. 1E, a second blank wafer 16 undergoes a similar process as that described above for the wafer 10' to form depressions 18. In FIG. 1F, actuators 20 such as, for example, piezoelectric actuators, are formed on divided walls 21 of the depressions 18 in the depression wafer 16. In FIG. 1G, the thinned IC wafer 10' is bonded to the depression wafer 16 using, for example, anodic wafer bonding to form IC wafer 22. The depressions 18 and the openings 14 form reservoirs 24 and 24'.

In FIG. 1H, the reservoirs 24 and 24' are filled with one or more chemicals. In various embodiments, the reservoirs 24 and 24' are each filled with the same type of chemical or chemicals. In various embodiments, the reservoirs 24 and 24' are each filled with different types of chemicals. The chemicals may be, for example, the following either alone or in combination: C4, RDX, HMX, Semtex, pentaerythritoltetranitrate, TNT, Picric acid, tri-nitrobenzene, tri-nitrophenol, nitroglycerine, nitrocellulose, nitroguanadine, a nitromethane/ammonium nitrate mixture, an ammonia/hydrogen peroxide mixture, any suitable type of nitrated compound, lead azide, silver azide, mercury fulminate, any suitable type of shock sensitive azo or peroxy compound, etc.

Figure 1I:
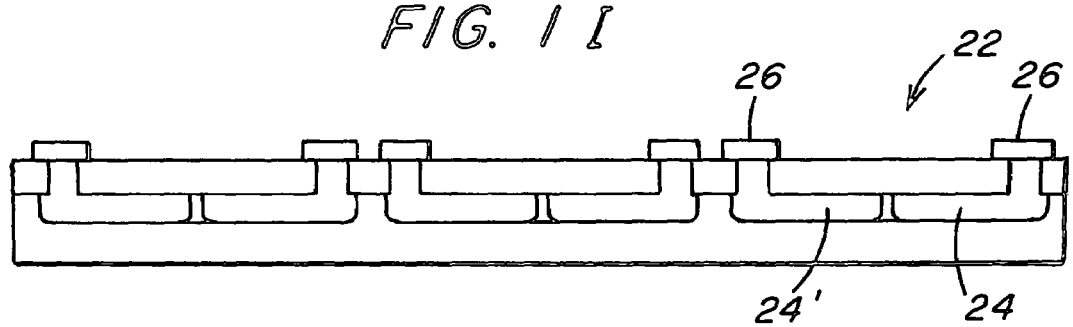
Figure 1J:
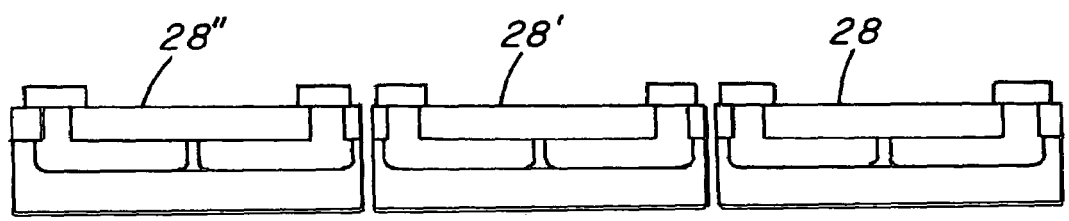

In FIG. 1I, caps 26 have been secured to the package 22 to seal the reservoirs 24 and 24'. The caps 26 may be secured by, for example, epoxy. In FIG. 1J, the IC wafer, is singulated into individual chips 28, 28' and 28" using, for example, a wafer saw.

In operation and according to various embodiments, when tampering or a similar event is detected, a signal is sent to the actuator 20, which is breached in response to the signal. A breach of the actuator 20 causes chemical or chemicals in the reservoirs 24 and 24' to mix and detonate, thus destroying and/or deforming at least a portion of the chip 28.

Figure 2A:
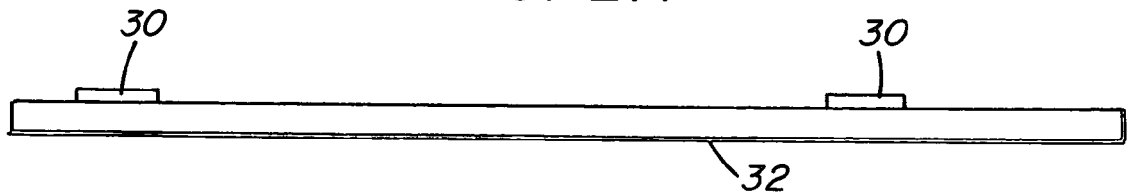
FIGS. 2A through 2G illustrate embodiments of a cross section of a destructor interposer in various stages of fabrication.
Figure 2B:
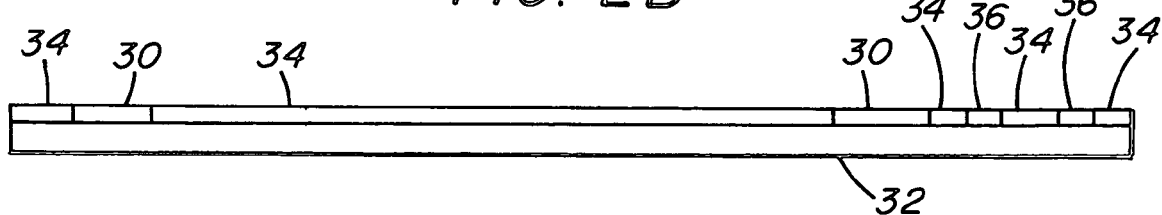
Figure 2C:
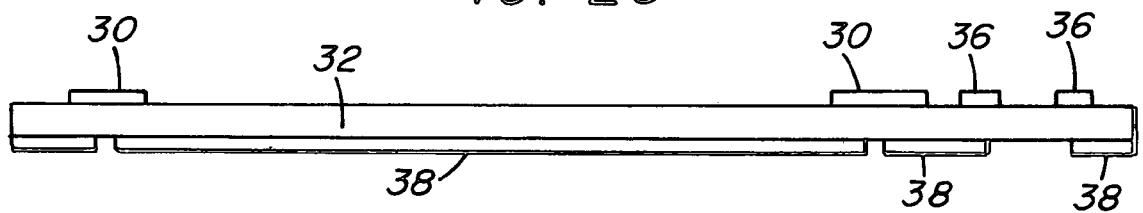
Figure 2D:
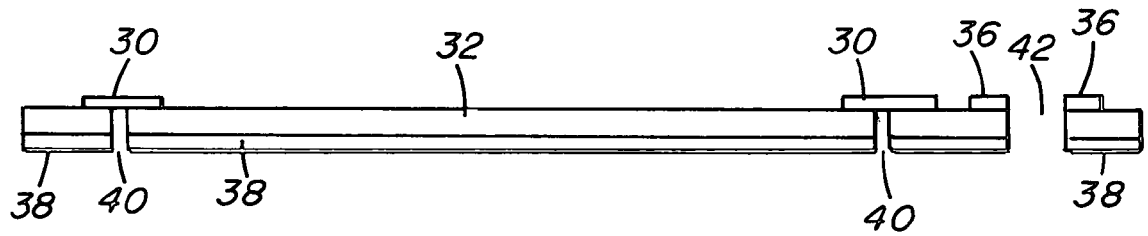
Figure 2E:

FIGS. 2A through 2G illustrate embodiments of a cross section of a destructor interposer in various stages of fabrication. In FIG. 2A, bonding pads 30 are formed on a substrate 32 (e.g., a Silicon substrate) by using, for example, standard wafer fabrication metallization processes. In FIG. 2B, photoresist 34 is deposited on the wafer 32 to pattern the footprint of the IC that is to be formed on the substrate 32, including window frames 36. In FIG. 2C, after masking, hardening, and etching, a second photoresist layer 38 is deposited on the underside of the substrate 32 to define vias and an opening. As shown in FIG. 2D, after masking, hardening, and etching, vias 40 and opening 42 are created. In FIG. 2E, the photoresist layer 38 is stripped and the vias 40 are filled with a conductive material.

Figure 2F:
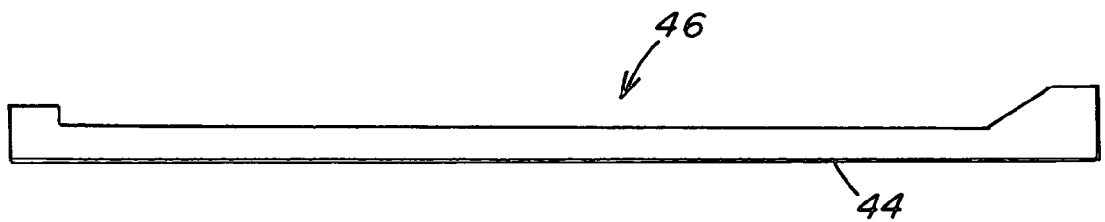
Figure 2G:
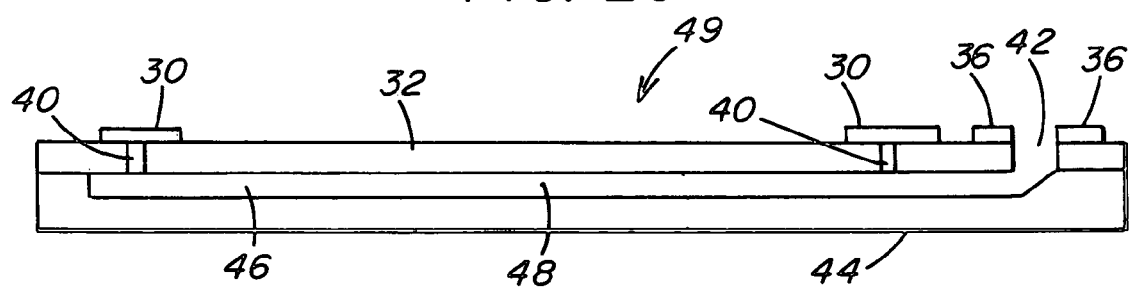

In FIG. 2F, a second substrate 44 is fabricated in a similar manner as that described in connection with the substrate 32 of FIGS. 2A through 2E such that a depression 46 is formed. In FIG. 2G, the substrate 32 is bonded to the substrate 44 to create an interposer 49 by, for example, anodic bonding such that the opening 42 and the depression 46 form a reservoir 48.

Figure 2H:
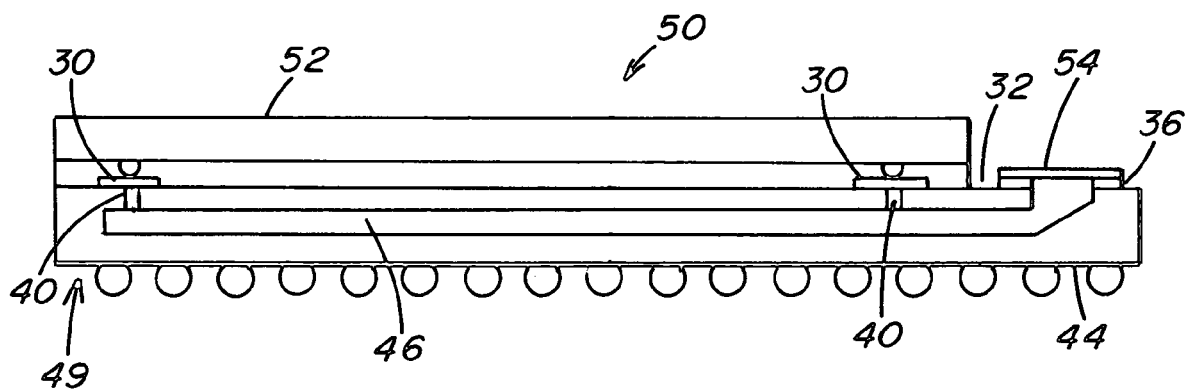
FIG. 2H illustrates an embodiment of a cross section of a destructor electronic device employing flip chip bonding.

In FIG. 2H, the destructor electronic device 50 is formed by bonding an integrated circuit (IC) chip 52 onto the interposer 49 at the bonding pads 30. The reservoir 46 is filled with a chemical or chemicals, such as an explosive chemical, and a cap 54 is attached to the interposer 49 by, for example, epoxy bonding.

In operation, if tampering is detected by some sensor in the package 50, an actuator (not shown) can send an electrical signal through the vias 40 such that the chemical or chemicals in the reservoir 46 detonate or ignite by, for example, a chemical reaction caused by the current of the electrical signal passing through the chemical or chemicals.

Figure 3:
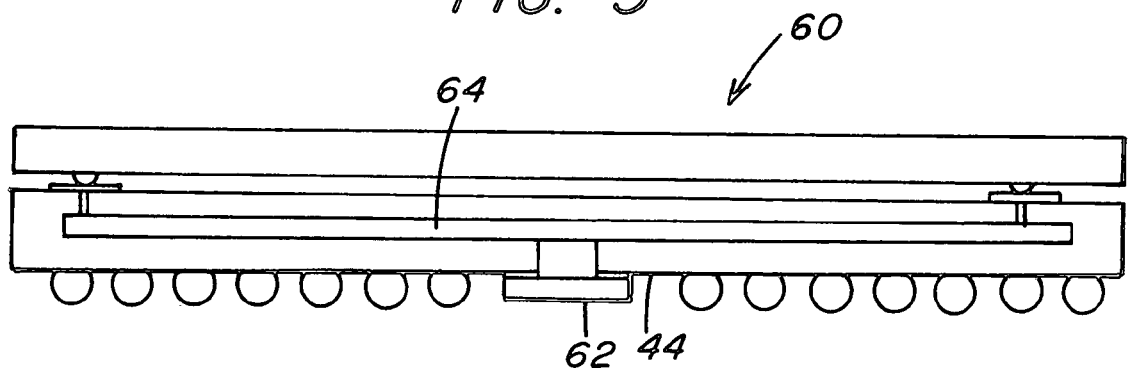
FIG. 3 illustrates another embodiment of a cross section of a destructor electronic device employing flip chip bonding.

FIG. 3 illustrates another embodiment of a cross section of a destructor electronic device 60 employing flip chip bonding. The destructor electronic device 60 is similar to the electronic device 50 of FIG. 2H except that a cap 62 is formed on the underside of the substrate 44 after a reservoir 64 is filled with a chemical or chemicals.

Figure 4:
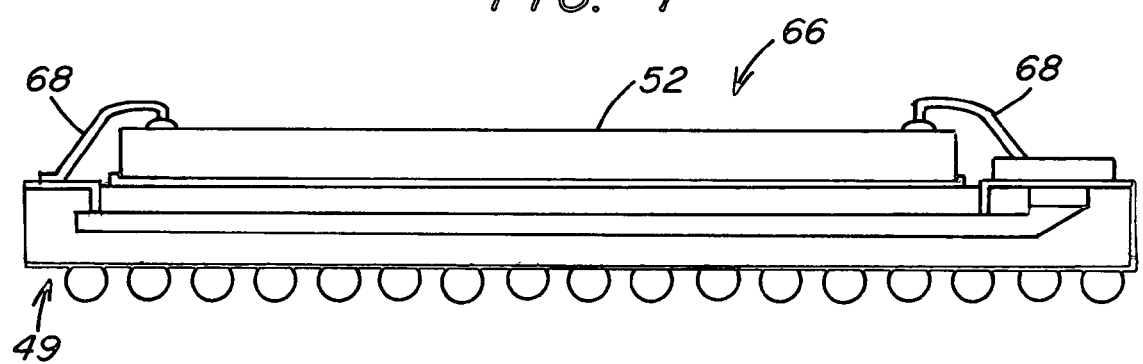
FIG. 4 illustrates an embodiment of a cross section of a destructor electronic device employing wire bonding.
Figure 5:
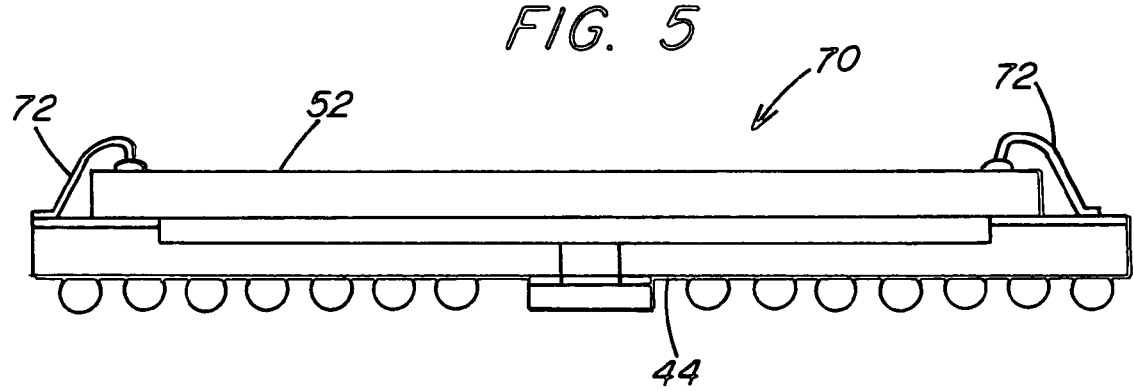
FIG. 5 illustrates another embodiment of a cross section of a destructor electronic device employing wire bonding.

FIG. 4 illustrates an embodiment of a cross section of a destructor electronic device 66 employing wire bonding. The electronic device 66 is similar to the destructor electronic device 50 of FIG. 2H except that the integrated circuit chip 52 is attached to the interposer 49 and electrically connected to the interposer through wire bonds 68. FIG. 5 illustrates an embodiment of a cross section of a destructor electronic device 70 employing wire bonding. The destructor electronic device 70 is similar to the destructor electronic device 60 of FIG. 3 except that the thinned IC chip 52 is directly anodic bonded to the depression half of the interposer 44 and electrically connected to the interposer through wire bonds 72.

It is to be understood that the figures and descriptions of embodiments of the present invention have been simplified to illustrate elements that are relevant for a clear understanding of the present invention, while eliminating, for purposes of clarity, other elements. Those of ordinary skill in the art will recognize, however, that these and other elements may be desirable for practice of various aspects of the present embodiments. However, because such elements are well known in the art, and because they do not facilitate a better understanding of the present invention, a discussion of such elements is not provided herein.

It can be appreciated that, in some embodiments of the present methods and systems disclosed herein, a single component can be replaced by multiple components, and multiple components replaced by a single component, to perform a given function or functions. Except where such substitution would not be operative to practice the present methods and systems, such substitution is within the scope of the present invention.

Examples presented herein, including operational examples, are intended to illustrate potential implementations of the present method and system embodiments. It can be appreciated that such examples are intended primarily for purposes of illustration. No particular aspect or aspects of the example method, product, computer-readable media, and/or system embodiments described herein are intended to limit the scope of the present invention.

It should be appreciated that figures presented herein are intended for illustrative purposes and are not intended as construction drawings. Omitted details and modifications or alternative embodiments are within the purview of persons of ordinary skill in the art. Furthermore, whereas particular embodiments of the invention have been described herein for the purpose of illustrating the invention and not for the purpose of limiting the same, it will be appreciated by those of ordinary skill in the art that numerous variations of the details, materials and arrangement of parts/elements/steps/functions may be made within the principle and scope of the invention without departing from the invention as described in the appended claims.

What is claimed is:

1. A semiconductor chip, comprising:
   an integrated circuit chip;
   a depression member attached to the integrated circuit chip, wherein the integrated circuit chip and the depression member define a cavity therebetween;
   a first chemical located in the cavity;
   a second chemical located in the cavity, wherein the first chemical and the second chemical detonate when mixed together;
   a stress sensitive material located in the cavity, wherein the stress sensitive material forms a physical barrier to prevent mixing of the first chemical and the second chemical;
   wherein the stress sensitive material is configured to breach in response to a signal applied to the stress sensitive material to cause the first chemical and the second chemical to mix and detonate.

2. The semiconductor chip of claim 1, wherein the stress sensitive material is a material selected from the group consisting of a piezoelectric material, a shape-memory alloy, a thermoelectric material, and a swellable polymer gel.

3. The semiconductor chip of claim 1, wherein the first chemical is selected from the group consisting of nitromethane and ammonia and wherein the second chemical is selected from the group consisting of ammonium nitrate and hydrogen peroxide.

4. The semiconductor chip of claim 1, further comprising a cap covering an opening in the cavity.

5. The semiconductor chip of claim 1, wherein a wafer comprising the first integrated circuit chip is thinned to about 0.005 inches.

6. A semiconductor interposer, comprising:
   a first substrate comprising a first surface and a second surface opposite the first surface;
   a second substrate attached to the second surface of the first substrate, wherein the second surface of the first substrate and the second substrate define a cavity therebetween;
   a bonding pad disposed on the first surface of the first substrate to receive an integrated circuit chip; and a chemical located in the cavity, wherein the first substrate forms a barrier between the bonding pad and the chemical, and wherein the chemical is configured to detonate upon receipt of a signal from a sensor to break the first substrate such that an integrated circuit chip received by the bonding pad is broken.

7. A semiconductor interposer, comprising:
   a first substrate comprising a first surface and a second surface opposite the first surface;
   a second substrate attached to the second surface of the first substrate, wherein the second surface of the first substrate and the second substrate define a cavity therebetween;
   a bonding pad disposed on the first surface of the first substrate to receive an integrated circuit chip;
   a stress-sensitive material located in the cavity, wherein the first substrate forms a barrier between the bonding pad and the stress sensitive material, and wherein the stress sensitive material is configured to move when an electrical signal is applied to the stress sensitive material, a magnitude of the movement to cause the stress sensitive material to apply a mechanical force directly to the first substrate to break the first substrate such that an integrated circuit chip received by the bonding pad is broken.

8. The semiconductor interposer of claim 7, wherein the stress sensitive material is a material selected from the group consisting of a piezoelectric material, a shape-memory alloy, a thermoelectric material, and a swellable polymer gel.

9. A destructor electronic device, comprising:
   a first substrate comprising a first surface and a second surface opposite the first surface;
   an integrated circuit chip attached to the first surface of the first substrate;
   a second substrate attached to the second surface of first substrate, wherein the second surface of the first substrate and the second substrate define a cavity therebetween;
   a chemical located in the cavity, wherein the first substrate forms a barrier between the integrated circuit chip and the chemical; and
   a conductive via extending from the first surface of the first substrate to the cavity via the second surface of the substrate, wherein the chemical is configured to detonate in response to an electrical signal passed through the conductive via such that the integrated circuit chip is broken.

10. The destructor electronic device of claim 9, further comprising a wire bond between the integrated circuit chip and the conductive via.

11. The destructor electronic device of claim 9, further comprising a flip chip bond between the integrated circuit chip and the conductive via.

12. The destructor electronic device of claim 9, wherein the first and second substrates comprise a material selected from the group consisting of aluminum oxide, silicon dioxide, beryllium oxide ceramic, high temperature co-fired ceramic (HTCC), low temperature co-fired ceramic (LTCC), gallium arsenide, an epoxy-glass laminate, and a polyimide-glass laminate.

13. The destructor electronic device of claim 9, wherein the chemical is selected from the group consisting of C4, RDX, HMX, Semtex, pentaerythritoltetranitrate, TNT, Picric acid, tri-nitrobenzene, tri-nitrophenol, nitroglycerine, nitrocellulose, nitroguanadine, a nitromethane/ammonium nitrate mixture, an ammonia/hydrogen peroxide mixture, a nitrated compound, lead azide, silver azide, mercury fulminate, a shock sensitive azo compound, and a shock sensitive peroxy compound.

14. A device comprising:
- a container defining a cavity;
- an integrated circuit chip attached to an exterior surface of the container;
- a first chemical located in the cavity;
- a second chemical located in the cavity, wherein the first chemical and the second chemical detonate when mixed together;
- a stress sensitive material located in the cavity, wherein the stress sensitive material forms a physical barrier to prevent mixing of the first chemical and the second chemical;
- wherein the stress sensitive material is configured to breach in response to a signal applied to the stress sensitive material to cause the first chemical and the second chemical to mix and detonate.

* * * * *